(12) United States Patent
Chen

(10) Patent No.: US 9,076,769 B2
(45) Date of Patent: Jul. 7, 2015

(54) FIXING DEVICE AND THERMAL MODULE INCORPORATING THE SAME

(75) Inventor: Chin-Hsien Chen, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 584 days.

(21) Appl. No.: 13/467,059

(22) Filed: May 9, 2012

(65) Prior Publication Data

US 2013/0135825 A1 May 30, 2013

(51) Int. Cl.
| | |
|---|---|
| H05K 7/20 | (2006.01) |
| F28F 7/00 | (2006.01) |
| H05K 7/00 | (2006.01) |
| H01L 23/467 | (2006.01) |
| H01L 23/40 | (2006.01) |
| H01L 23/427 | (2006.01) |
| F28D 15/02 | (2006.01) |
| G06F 1/20 | (2006.01) |
| H01L 23/367 | (2006.01) |

(52) U.S. Cl.
CPC .......... *H01L 23/467* (2013.01); *H01L 23/367* (2013.01); *H01L 23/4093* (2013.01); *H01L 23/427* (2013.01); *F28D 15/0275* (2013.01); *G06F 1/20* (2013.01); *H01L 2924/0002* (2013.01)

(58) Field of Classification Search
CPC ............ H05K 7/20; H05K 7/00; H05K 5/00; H05K 7/203; F28F 7/00; F28F 13/00; G06F 1/20; H01L 23/34; H01L 23/436; H01L 23/473
USPC ............ 361/679.46, 679.48, 679.52, 679.54, 361/700–712, 719, 720, 732, 753; 165/80.2, 80.3, 80.5, 104.33, 121–126, 165/185; 257/706–726; 174/15.1, 15.2, 174/16.3, 252; 24/295, 296, 457, 458, 495, 24/517, 546, 573, 625, 581, 589, 981; 248/505, 506, 510, 316.7
See application file for complete search history.

(56) References Cited

U.S. PATENT DOCUMENTS

| | | | |
|---|---|---|---|
| 7,170,750 B2 * | 1/2007 | Tanaka ....................... | 361/719 |
| 7,405,937 B1 * | 7/2008 | Wang et al. ................ | 361/700 |
| 7,639,503 B2 * | 12/2009 | Tanaka ....................... | 361/719 |
| 7,710,724 B2 * | 5/2010 | Takeguchi et al. ......... | 361/700 |
| 7,855,889 B2 * | 12/2010 | Hung et al. ................. | 361/700 |
| 7,885,075 B2 * | 2/2011 | Li et al. ...................... | 361/701 |
| 7,965,512 B2 * | 6/2011 | Huang et al. ............... | 361/700 |
| 7,990,713 B2 * | 8/2011 | Liu et al. .................... | 361/700 |
| 8,064,201 B2 * | 11/2011 | Kuo et al. ................... | 361/700 |
| 8,085,539 B2 * | 12/2011 | Yang .......................... | 361/700 |
| 8,125,783 B2 * | 2/2012 | Tanaka ....................... | 361/720 |
| 8,861,201 B2 * | 10/2014 | Hata .......................... | 361/700 |

* cited by examiner

*Primary Examiner* — Michail V Datskovskiy
(74) *Attorney, Agent, or Firm* — Novak Druce Connolly Bove + Quigg LLP

(57) ABSTRACT

An exemplary fixing device is for mounting a heat conduction plate to two electronic components. The fixing device includes a first mounting clip and a second mounting clip connected to the first mounting clip through arms. The first mounting clip includes a pressing plate pressing a first contacting portion of the heat conduction plate against one electronic component. The second mounting clip includes two pressing tabs pressing a second contacting portion of the heat conduction plate against the other electronic component. The pressing plate and the two pressing tabs are made of a single monolithic piece of material.

20 Claims, 3 Drawing Sheets

FIXING DEVICE AND THERMAL MODULE INCORPORATING THE SAME

BACKGROUND

1. Technical Field

The present disclosure relates to fixing devices and thermal modules incorporating the fixing devices, wherein the fixing devicesd thermal modules are incorporated in apparatuses such as electronic apparatuses.

2. Description of Related Art

Central processing units (CPUs) of computers generate a large amount of heat in operation. In general, heat dissipation devices are mounted on the CPUs for removing heat from the CPUs. For some kinds of computers, other electronic components besides the CPU are also required to be cooled. Therefore, one kind of heat dissipation device uses a heat conduction plate to conduct heat from both the CPU and another electronic component. The heat conduction plate has an end contacting the CPU, and an opposite end contacting the other electronic component. However, the heat dissipation device generally has only one fixing device pressing the end of the heat conduction plate against the CPU. The pressure produced by the fixing device is prone to affect the opposite end of the heat conduction plate, and the opposite end is liable to lift. This may result in unreliable contact between the opposite end of the heat conduction plate and the other electronic component.

What is needed, therefore, is a fixing device and a thermal module incorporating the fixing device which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
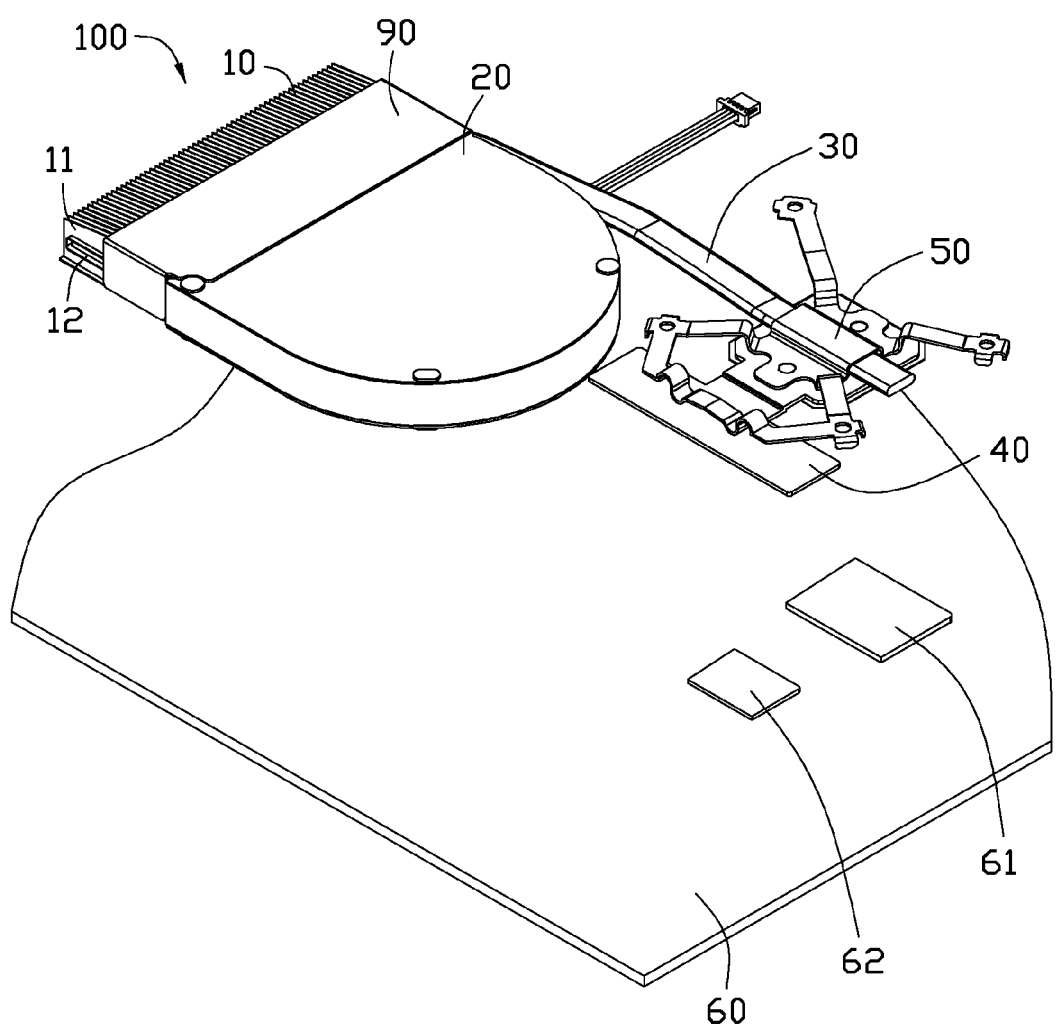
FIG. 1 is an isometric, assembled view of a thermal module in accordance with an embodiment of the present disclosure, wherein part of a printed circuit board with two electronic components positioned thereon is shown below the thermal module.

Referring to FIG. 1, a thermal module 100 in accordance with an embodiment of the present disclosure is shown. The thermal module 100 includes a fan duct 20, a fan (not visible) received in the fan duct 20, a heat sink 10 mounted to the fan duct 20, a heat pipe 30 fixed to the heat sink 10, a fixing device 50, and a heat conduction plate 40 connected to the heat pipe 30. In FIG. 1, part of a printed circuit board 60 is shown below the thermal module 100. The printed circuit board 60 includes a first electronic component 61 and a second electronic component 62 mounted thereon. The first electronic component 61 has a size larger than that of the second electronic component 62. The first electronic component 61 generates more heat than the second electronic component 62. The second electronic component 62 is located adjacent to the first electronic component 61.

The fan duct 20 defines an opening (not visible) in a bottom face thereof corresponding to the fan. A flow of air can enter the fan duct 20 through the opening. The heat sink 10 is fixed to a lateral side of the fan duct 20 through a bracket 90. The heat sink 10 includes a plurality of parallel fins 11 arranged side by side. Portions of each two adjacent fins 11 abut against each other. Each fin 11 defines a slot 12 in a middle thereof to receive an end of the heat pipe 30.

Figure 2:
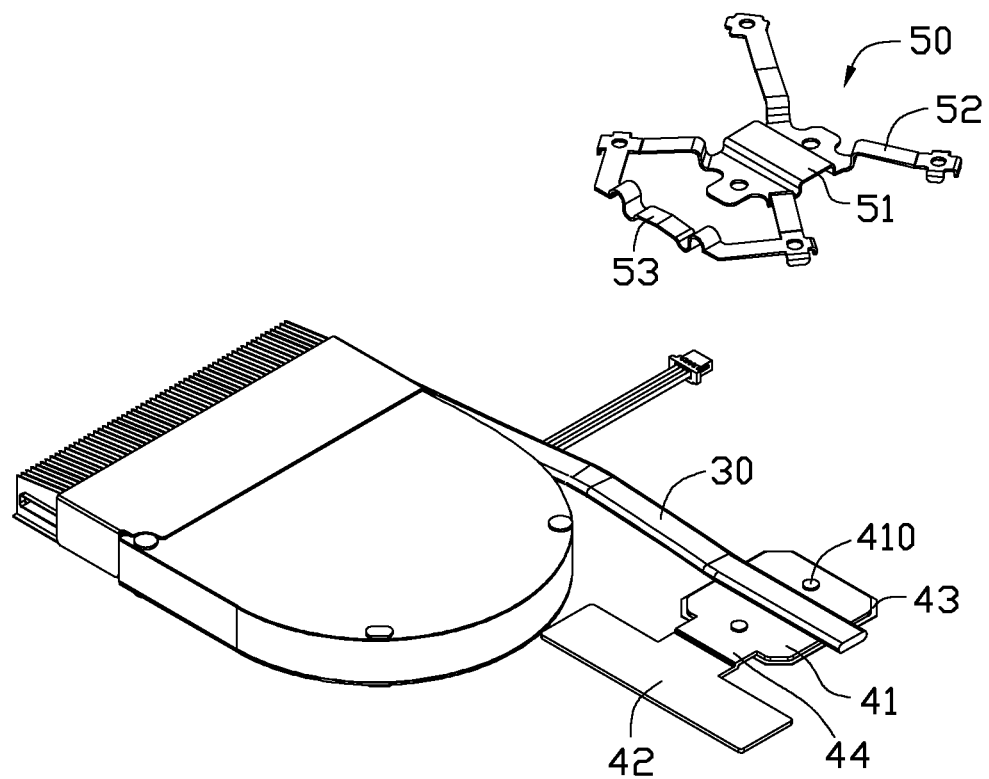
FIG. 2 is an exploded view of the thermal module of FIG. 1.
Figure 3:
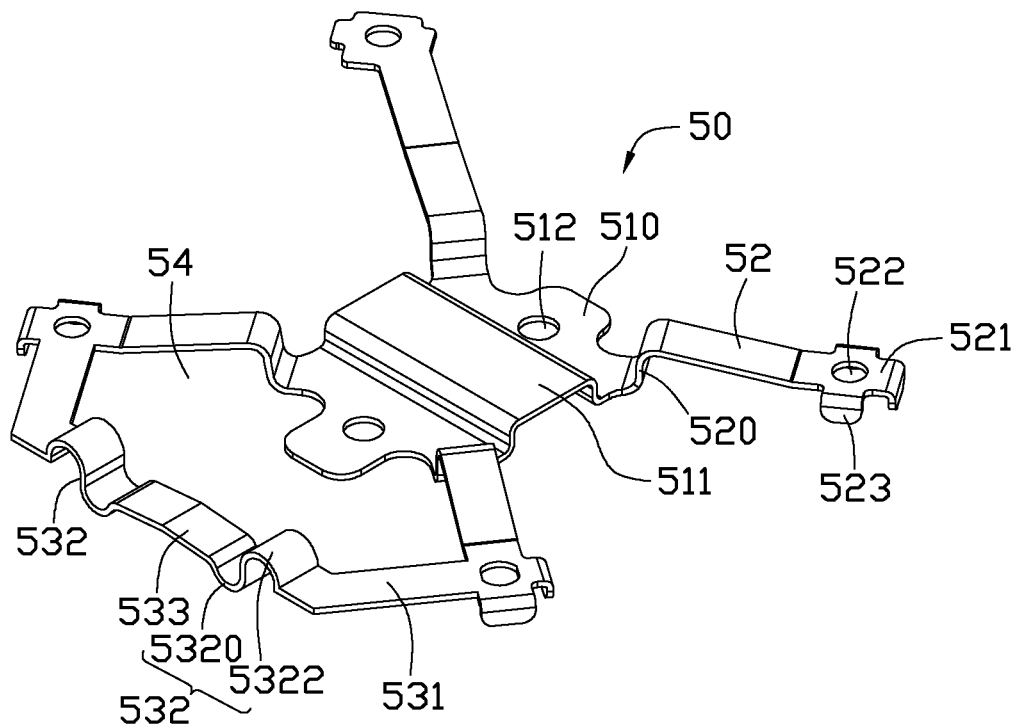
FIG. 3 is an enlarged view of a fixing device of the thermal module of FIG. 2.

Also referring to FIGS. 2-3, the heat conduction plate 40 includes a first contacting portion 41 and a second contacting portion 42. The first contacting portion 41 is approximately square-shaped. A lateral flange 43 extends outwardly from a circumferential periphery of the first contacting portion 41. The second contacting portion 42 is rectangular, and has a width less than that of the first contacting portion 41 and a length larger than that of the first contacting portion 41. The first contacting portion 41 is thicker than the second contacting portion 42. The first contacting portion 41 and the second contacting portion 42 connect with each other via a bridge 44. Two protrusions 410 protrude upwardly from a top face of the first contacting portion 41. An opposite end of the heat pipe 30 is disposed on the top face of the first contacting portion 41 between the two protrusions 410. A bottom face of the first contacting portion 41 contacts the first electronic component 61, and a bottom face of the second contacting portion 42 contacts the second electronic component 62, so that the first and second contacting portions 41, 42 absorb heat from the first electronic component 61 and the second electronic component 62.

The fixing device 50 may be made of a single piece of an elastically deformable metal sheet. The fixing device 50 includes a first mounting clip 51, a second mounting clip 53 spaced from the first mounting clip 51, and four arms 52 extending from the first mounting clip 51. The first mounting clip 51 includes a pressing plate 510, and a raised portion 511 protruding upwardly from a central area of the pressing plate 510. The pressing plate 510 is flat, and defines two holes 512 in two opposite lateral sides thereof. The two protrusions 410 of the first contacting portion 41 each extend through a corresponding hole 512 to position the pressing plate 510 on the heat conduction plate 40. The raised portion 511 is located between the two holes 512. The raised portion 511 may be formed by punching the central area of the pressing plate 512 upwardly. The raised portion 511 has a shape conforming with an outer circumferential periphery of the opposite end of the heat pipe 30. The opposite end of the heat pipe 30 is pressed by the raised portion 511 against the top face of the first contacting portion 41 of the heat conduction plate 40, to transfer heat from the heat conduction plate 40 to the heat sink 10. The four arms 52 each extend from a corresponding corner of the pressing plate 510. Each arm 52 includes a connection section 520 extending upwardly from the corresponding corner of the pressing plate 510, and a retention section 521 extending outwardly from a top end of the connection section 510. The retention section 521 defines a through hole 522 in a free end thereof. A fastener (not shown) can extend through the through hole 522 of the retention section 521 of a corresponding arm 52 into the printed circuit board 60 to fix the corresponding arm 52 on the printed circuit board 60. As a result, the pressing plate 510 is brought by elastic force of the arms 52 to press downwardly against the first contacting portion 41 of the heat conduction plate 40.

The second mounting clip 53 includes a connection tab 533, two pressing tabs 532 formed on two opposite ends of the connection tab 533, and two beams 531 connecting the two pressing tabs 532 with two corresponding arms 52, respectively. Each beam 531 is obliquely angled relative to an adjacent pressing tab 532, and is perpendicular to the adjacent arm 52. Each pressing tab 532 is curved, and has a shape substantially like the curvature of a single cycle of ave. In particular, each pressing tab 532 has a trough 5320 located lower than the connection tab 533 the beams 531, and a crest 5322 located higher than the connection tab 533 and the beams 531. A joint of the trough 5320 and the crest 5322 of each pressing tab 532 is located at the same level as that of the connection tab 533. Two nds of the two pressing tabs 532 connect with each other through the connection tab 533. Each beam 531 interconnects an end of an adjacent crest 522 and an end of the adjacent arm 531. With the above-described configuration, each pressing tab 532 is more elastically deformable than the pressing plate 510.

A space 54 is surrounded by the second mounting clip 53, the two corresponding arms 52 and the pressing plate 510. The bridge 44 of the heat conduction plate 40 is exposed below the space 54. The two troughs 5320 of the two pressing tabs 532 are brought by the two beams 531 in unison with the two corresponding arms 52 to press downwardly against a top face of the second contacting portion 42 of the heat conduction plate 40. Thereby, the second contacting portion 42 is pressed downwardly towards the second electronic component 62. The contacting area between the second contacting portion 42 and each pressing tab 532 is smaller than that between the first contacting portion 41 and the pressing plate 510.

The fixing device 50 not only presses the first contacting portion 41 of the heat conduction plate 40 downwardly against the first electronic component 61, but also simultaneously presses the second contacting portion 42 of the heat conduction plate 40 downwardly against the second electronic component 62. Unlike with conventional fixing devices, the downward pressing of the first contacting portion 41 is compatible with the downward pressing of the second contacting portion 42. In particular, the downward pressing of the first contacting portion 41 has no tendency to lift the second contacting portion 42, and diminished contact between the second contacting portion 42 and the second electronic component 62 is prevented. Accordingly, the first contacting portion 41 and the second contacting portion 42 of the heat conduction plate 40 can have reliable contact with the first electronic component 61 and the second electronic component 62, respectively. Furthermore, the pressing tabs 532 are more elastically deformable than the pressing plate 510, whereby the pressing tabs 532 can produce larger resilient force acting on the second contacting portion 42. Thereby, the second contacting portion 42 can be in tighter contact with the second electronic component 62.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A fixing device for fixing a heat conduction plate on two electronic components, comprising:
   a first mounting clip comprising a pressing plate and four arms extending outwardly from the pressing plate; and
   a second mounting clip comprising a connection tab, two pressing tabs extending from two opposite ends of the connection tab, and two beams, one of the beams interconnecting one of the pressing tabs and an adjacent one of the arms, and the other beam interconnecting the other pressing tab and an adjacent another one of the arms.

2. The fixing device of claim 1, wherein each pressing tab is more elastically deformable than the pressing plate.

3. The fixing device of claim 1, wherein each pressing tab is curved.

4. The fixing device of claim 3, wherein each pressing tab comprises a trough and a crest connecting the trough, the trough connecting the connection tab, and the crest connecting the corresponding beam.

5. The fixing device of claim 4, wherein the trough is located lower than the connection tab, and the crest is located higher than the connection tab.

6. The fixing device of claim 1, wherein each beam is inclined relative to the adjacent pressing tab and is substantially perpendicular to the corresponding adjacent arm.

7. The fixing device of claim 1, wherein the pressing plate has a size larger than that of each pressing tab.

8. The fixing device of claim 1, wherein each arm comprises a connection section extending upwardly from a corner of the pressing plate, and a retention section extending outwardly from a top of the connection section, and each beam connects the retention section of the corresponding adjacent arm.

9. A thermal module for dissipating heat from two electronic components, comprising:
   a heat conduction plate comprising a first contacting portion and a second contacting portion for absorbing heat from the two electronic components, respectively; and
   a fixing device comprising:
      a first mounting clip comprising a pressing plate for pressing against the first contacting portion of the heat conduction plate; and
      a second mounting clip connected with the first mounting clip through an arm, the first mounting clip comprising a pressing tab for pressing against the second contacting portion of the heat conduction plate.

10. The thermal module of claim 9, wherein the pressing tab is more elastically deformable than the pressing plate.

11. The thermal module of claim 9, wherein the pressing tab has an area contacting the second contacting portion of the heat conduction plate smaller than an area wherein the pressing plate contacts the first contacting portion of the heat conduction plate.

12. The thermal module of claim 9, wherein the pressing tab is curved and comprises a trough pressing against the heat conduction plate.

13. The thermal module of claim 12, wherein the pressing tab further comprises a crest bended upwardly from the trough.

14. The thermal module of claim 13, wherein the second mounting clip further comprises a beam connecting the crest of the pressing tab, the crest being located higher than the beam, and the trough being located lower than the beam.

15. The thermal module of claim 9, wherein the arm interconnects the beam and the pressing plate.

16. The thermal module of claim 15, wherein the beam is perpendicular to the arm and inclined relative to the pressing tab.

17. The thermal module of claim 9, wherein the first contacting portion of the heat conduction plate has two protrusions protruding upwardly from a top face thereof, the pressing plate defining two holes to receive the two protrusions, respectively.

18. The thermal module of claim 17, wherein the pressing plate has a raised portion protruding upwardly from a central area thereof, the raised portion being located between the two holes.

19. The thermal module of claim 18, further comprising a heat pipe, wherein the heat pipe has an end sandwiched between the raised portion of the pressing plate and the heat conduction plate.

20. An electronic assembly comprising:
- a printed circuit board having a first electronic component and a second electronic component mounted thereon;
- a heat conduction plate comprising a first contacting portion contacting the first electronic component, and a second contacting portion contacting the second electronic component;
- a first mounting clip attached to the circuit board and comprising a pressing plate pressing the first contacting portion against the first electronic component; and
- a second mounting clip connected with the first mounting clip and comprising a pressing tab pressing the second contacting portion against the second electronic component.

* * * * *